United States Patent
Ting et al.

(10) Patent No.: US 11,127,630 B2
(45) Date of Patent: Sep. 21, 2021

(54) CONTACT PLUG WITHOUT SEAM HOLE AND METHODS OF FORMING THE SAME

(71) Applicant: Taiwan Semiconductor Manufacturing Company, Ltd., Hsinchu (TW)

(72) Inventors: Chih-Yuan Ting, Taipei (TW); Jyu-Horng Shieh, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 16/655,489

(22) Filed: Oct. 17, 2019

(65) Prior Publication Data

US 2020/0051856 A1    Feb. 13, 2020

Related U.S. Application Data

(63) Continuation of application No. 15/961,212, filed on Apr. 24, 2018, now Pat. No. 10,504,780, which is a
(Continued)

(51) Int. Cl.
| | |
|---|---|
| H01L 21/768 | (2006.01) |
| H01L 23/48 | (2006.01) |
| H01L 29/78 | (2006.01) |
| H01L 21/027 | (2006.01) |
| H01L 21/033 | (2006.01) |
| H01L 21/3105 | (2006.01) |
| H01L 21/321 | (2006.01) |
| H01L 21/3213 | (2006.01) |
| H01L 29/66 | (2006.01) |

(52) U.S. Cl.
CPC .... *H01L 21/76892* (2013.01); *H01L 21/0274* (2013.01); *H01L 21/0337* (2013.01); *H01L 21/31055* (2013.01); *H01L 21/32115* (2013.01); *H01L 21/32133* (2013.01); *H01L 21/32139* (2013.01); *H01L 21/7682* (2013.01); *H01L 21/7684* (2013.01); *H01L 21/76837* (2013.01); *H01L 21/76885* (2013.01); *H01L 21/76897* (2013.01); *H01L 23/481* (2013.01); *H01L 29/7833* (2013.01); *H01L 29/665* (2013.01);
(Continued)

(58) Field of Classification Search
CPC .......... H01L 21/7684; H01L 21/31055; H01L 21/76897; H01L 29/66477; H01L 29/665–66507; H01L 21/311–31144; H01L 21/28518; H01L 21/76892; H01L 21/32115; H01L 21/28052
See application file for complete search history.

(56) References Cited

U.S. PATENT DOCUMENTS

| | | |
|---|---|---|
| 8,153,519 B1 | 4/2012 | Yu |
| 9,472,448 B2 | 10/2016 | Ting et al. |

(Continued)

FOREIGN PATENT DOCUMENTS

JP        H1050950 A    2/1998

*Primary Examiner* — Changhyun Yi
(74) *Attorney, Agent, or Firm* — Slater Matsil, LLP

(57) ABSTRACT

A method includes forming a metallic layer over a Metal-Oxide-Semiconductor (MOS) device, forming reverse memory posts over the metallic layer, and etching the metallic layer using the reverse memory posts as an etching mask. The remaining portions of the metallic layer include a gate contact plug and a source/drain contact plug. The reverse memory posts are then removed. After the gate contact plug and the source/drain contact plug are formed, an Inter-Level Dielectric (ILD) is formed to surround the gate contact plug and the source/drain contact plug.

20 Claims, 10 Drawing Sheets

Related U.S. Application Data continuation of application No. 15/286,670, filed on Oct. 6, 2016, now Pat. No. 9,966,309, which is a continuation of application No. 14/213,051, filed on Mar. 14, 2014, now Pat. No. 9,472,448.

(52) U.S. Cl.
CPC .................. *H01L 29/66477* (2013.01); *H01L 2924/0002* (2013.01)

(56) References Cited

U.S. PATENT DOCUMENTS

| | | |
|---|---|---|
| 9,966,309 B2 | 5/2018 | Ting et al. |
| 2004/0169282 A1 | 9/2004 | Koh |
| 2005/0191812 A1 | 9/2005 | Pritchard et al. |
| 2010/0190328 A1 | 7/2010 | Hampp |
| 2011/0294069 A1 | 12/2011 | Bae et al. |
| 2012/0037962 A1* | 2/2012 | Breyta .............. H01L 21/31144 257/288 |
| 2012/0104512 A1* | 5/2012 | Horak ................. H01L 29/6653 257/401 |
| 2013/0049132 A1* | 2/2013 | Doris ................. H01L 21/7682 257/383 |
| 2013/0115559 A1 | 3/2013 | Bae et al. |
| 2013/0299920 A1* | 11/2013 | Yin ..................... H01L 29/6653 257/408 |
| 2014/0117420 A1* | 5/2014 | Chen ..................... H01L 23/485 257/288 |
| 2014/0284725 A1 | 9/2014 | McMullan et al. |
| 2014/0327080 A1 | 11/2014 | Hung et al. |

* cited by examiner

CONTACT PLUG WITHOUT SEAM HOLE AND METHODS OF FORMING THE SAME

PRIORITY CLAIM AND CROSS-REFERENCE

This application is a continuation of U.S. patent application Ser. No. 15/961,212, entitled "Contact Plug without Seam Hole and Methods of Forming the Same," filed on Apr. 24, 2018, which is a continuation of U.S. patent application Ser. No. 15/286,670, entitled "Contact Plug without Seam Hole and Methods of Forming the Same," filed on Oct. 6, 2016, now U.S. Pat. No. 9,966,309 issued May 8, 2018, which is a continuation of U.S. patent application Ser. No. 14/213,051, entitled "Contact Plug without Seam Hole and Methods of Forming the Same," filed on Mar. 14, 2014, now U.S. Pat. No. 9,472,448 issued Oct. 18, 2016, which applications are incorporated herein by reference.

BACKGROUND

In the formation of integrated circuits, semiconductor devices are formed on semiconductor substrates, and are then connected through metallization layers. The metallization layers are connected to the semiconductor devices through contact plugs. Also, external pads are connected to the semiconductor devices through the contact plugs.

Typically, the formation process of contact plugs includes forming an Inter-Layer Dielectric (ILD) over the semiconductor devices, forming contact openings in the ILD, and filling a metallic material in the contact openings. With the increasing down-scaling of integrated circuits, however, the above-discussed processes experience shortcomings. While the horizontal dimensions (for example, the poly-to-poly pitch between neighboring polysilicon lines) are continuously shrinking, the diameters of contact plug and the contact area between contact plugs to salicide are reduced. The thickness of the ILD is not reduced accordingly to the same scale as the reduction of the widths of the contact plugs. Accordingly, the aspect ratios of the contact plugs increase, causing the contact formation process to be increasingly more and difficult.

The down-scaling of integrated circuits results in several problems. First, it is increasingly more difficult to fill the contact openings without causing seam holes (voids) therein. In addition, when the lateral sizes of the contact plugs reduce, the sizes of seam holes do not reduce proportionally. This not only causes the effective area of the contact plugs for conducting currents to reduce non-proportionally, but also results in the subsequently formed contact etch stop layer and metal lines to fall into the seam holes, and hence results in reliability problems. As a result, the process window for forming the contact openings becomes narrower and narrower, and the formation of contact plugs has become the bottleneck for the down-scaling of integrated circuits.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

An integrated circuit structure including contact plugs for connecting to a Metal-Oxide-Semiconductor (MOS) device and the methods of forming the same are provided in accordance with exemplary embodiments. The intermediate stages of forming the contact plugs in accordance with some embodiment are illustrated. The variations of the embodiments are discussed. Throughout the various views and illustrative embodiments, like reference numbers are used to designate like elements.

Figure 1:
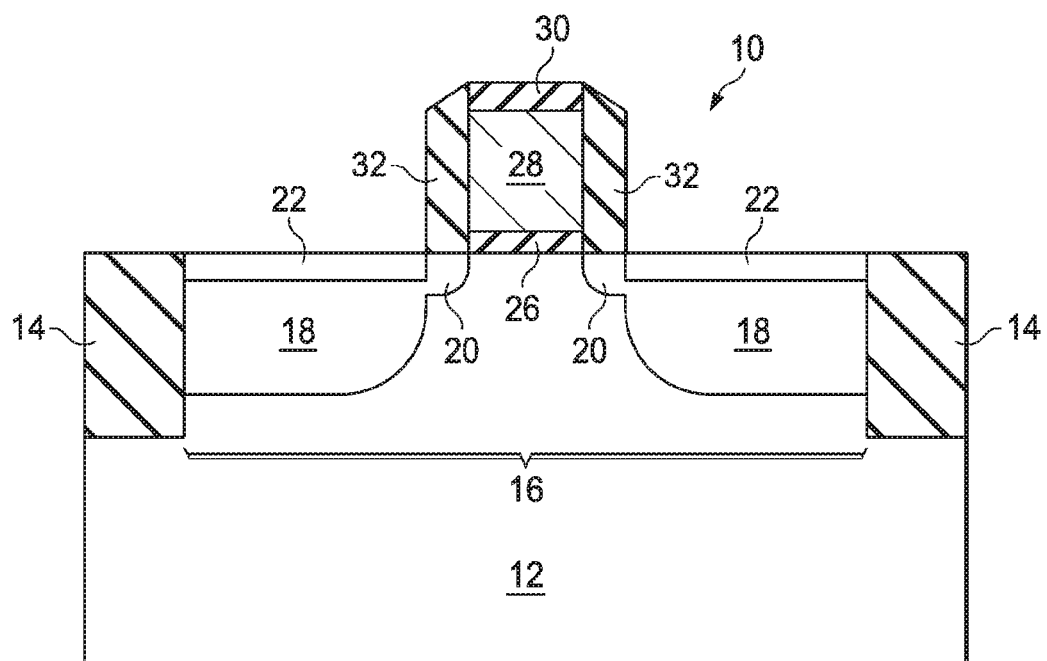
FIGS. 1 through 11B are cross-sectional views of intermediate stages in the formation of an integrated circuit structure in accordance with some exemplary embodiments.

FIG. 1 illustrates a cross-sectional view of a part of MOS device 10 in accordance with some exemplary embodiments. MOS device 10 is formed at the top surface of semiconductor substrate 12, which may comprise crystalline silicon, crystalline germanium, silicon germanium, a III-V compound semiconductor, or the like. Semiconductor substrate 12 may also be a bulk silicon substrate or a Silicon-On-Insulator (SOI) substrate. Shallow trench isolation (STI) region(s) 14 may be formed in semiconductor substrate 12 to isolate active region 16, which is used to form a gate stack thereon. MOS device 10 may further include source and drain regions (referred to as source/drain regions hereinafter) 18, Lightly Doped source/Drain (LDD) regions 20, and source/drain silicide regions 22.

A gate stack including gate dielectric 26, gate electrode 28, and gate silicide 30 is formed over active region 16. Gate dielectric 26 may be formed of silicon oxide, silicon nitride, silicon oxynitride, high-k dielectric materials such as hafnium oxide, lanthanum oxide, aluminum oxide, and/or the like. Gate electrode 28 may include a silicon-containing portion (such as a polysilicon region). Gate silicide 30 may be formed on the top of gate electrode 28. Gate spacers 32 are formed on the sidewalls of the gate stack.

Figure 2:
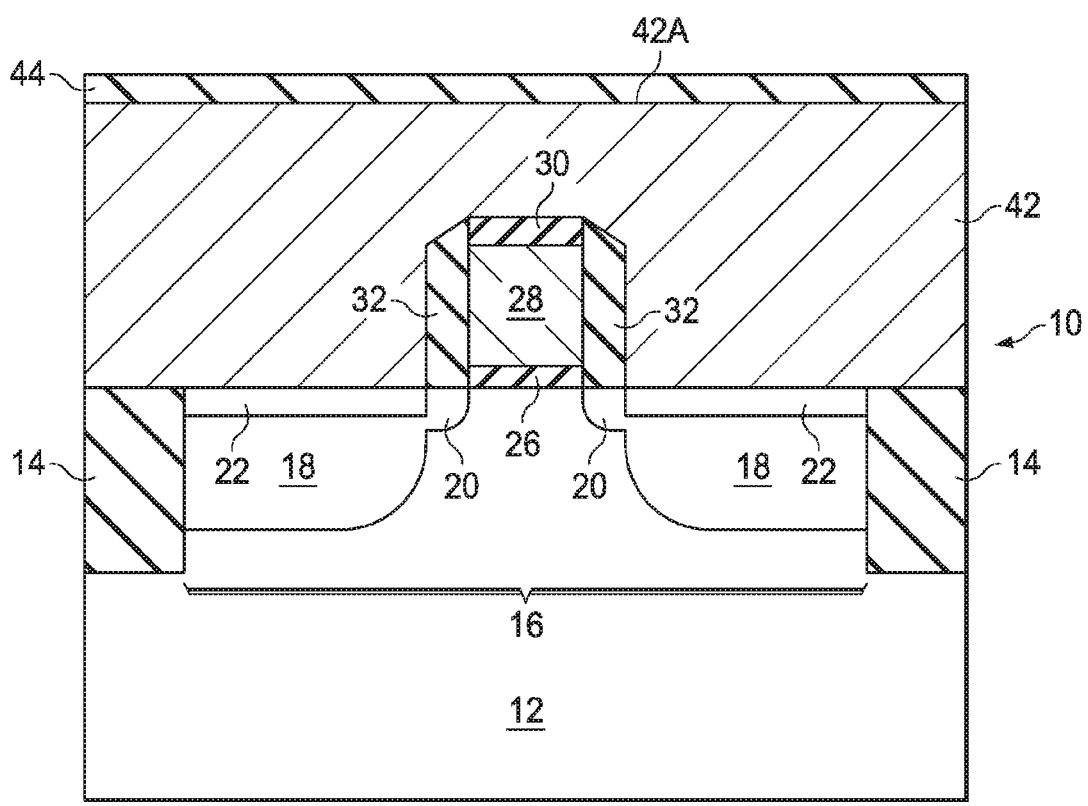

Referring to FIG. 2, conductive layer 42 is formed over MOS device 10. In some embodiments, conductive layer 42 is formed of a metallic material, and hence is referred to as a metallic layer or a substrate layer hereinafter, although it may also be formed of other conductive materials other than metal. Metallic layer 42 comprises tungsten or a tungsten alloy. For example, in addition to tungsten, metallic layer 42 may comprise aluminum, copper, titanium, tantalum, or combinations thereof. The top surface 42A of metallic layer 42 is higher than the top surface of the gate stack of MOS device 10. A Chemical Mechanical Polish (CMP) may be performed to level top surface 42A of metallic layer 42. In some embodiments, metallic layer 42 comprises first bottom surfaces in contact with the top surfaces of source/drain silicides 22, and a second bottom surface in contact with the top surface of gate silicide 30. In addition, since metallic layer 42 has a low aspect ratio, no seam holes or substantially no seam holes are formed in metallic layer 42.

Cap layer 44 is formed over metallic layer 42. In some embodiments, cap layer 44 comprises silicon oxide, silicon nitride, silicon oxynitride, silicon carbide, or other materials. Cap layer 44 acts as a surficial layer that protects the underlying metallic layer 42 when the overlying mask, which is used to pattern metallic layer 42, is formed.

Figure 3:
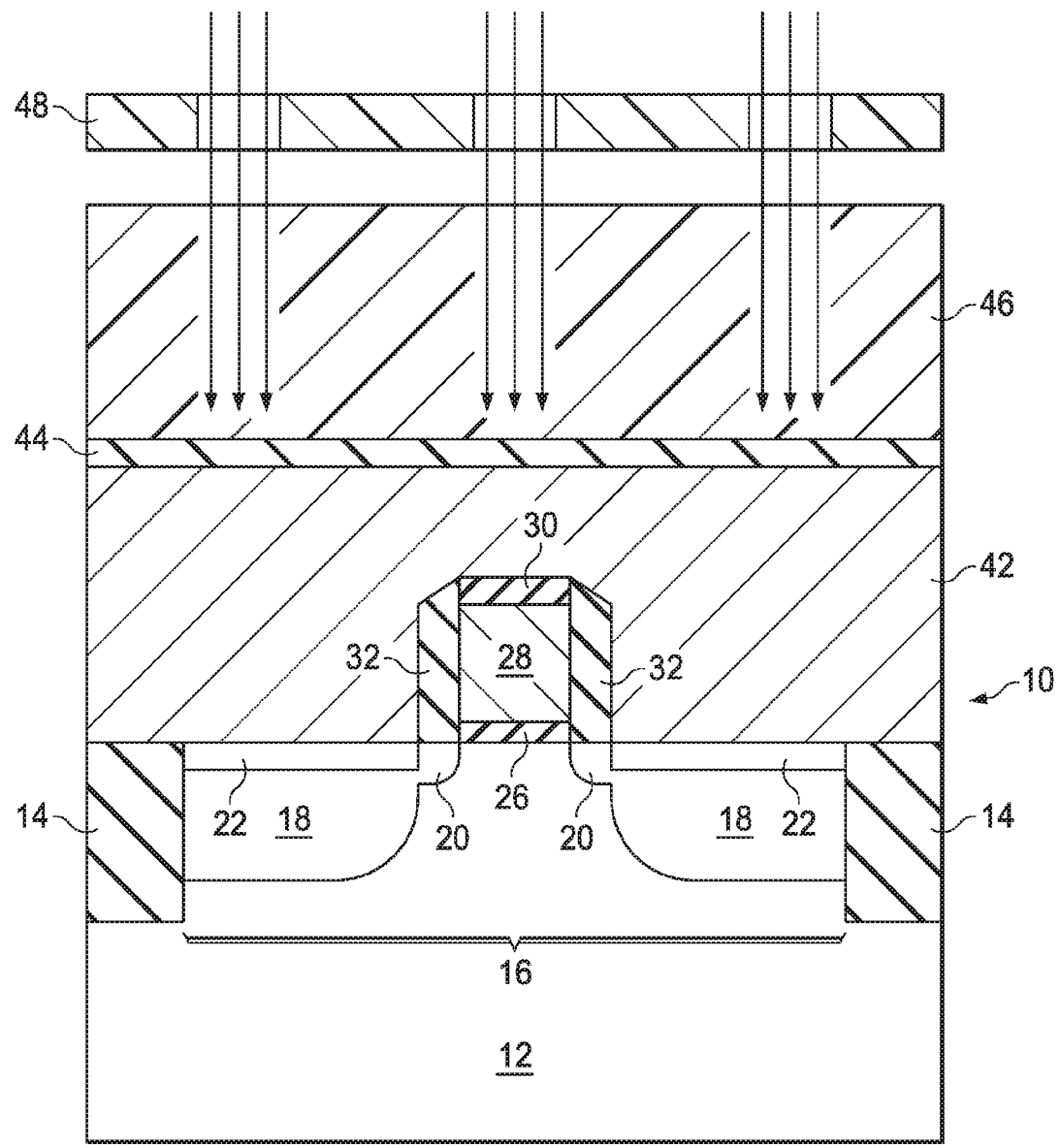
Figure 4:
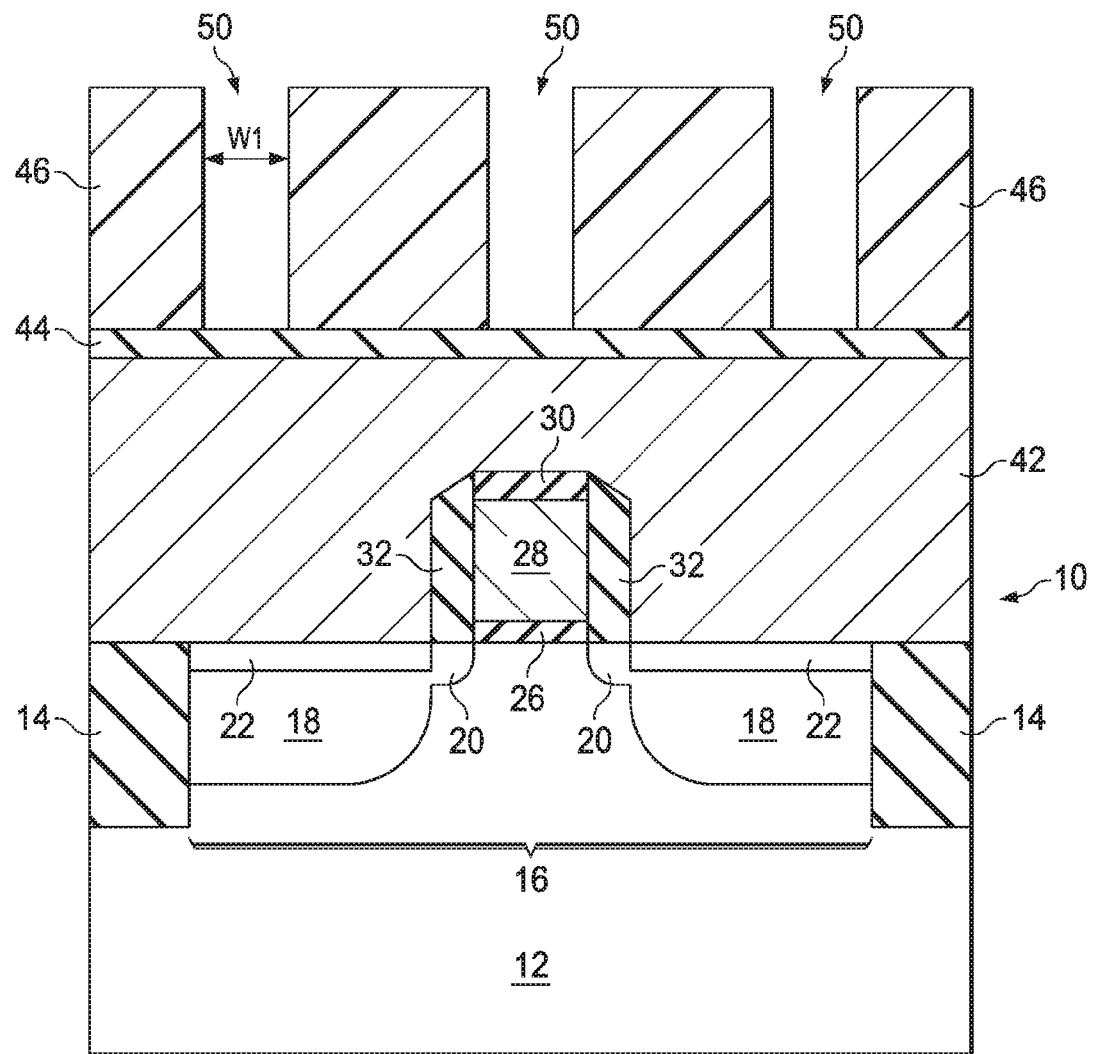

Next, referring to FIG. 3, photo resist 46 is applied. Lithography mask 48 is then used to expose photo resist 46. Lithography mask 48 includes transparent patterns and opaque patterns, wherein the transparent patterns allow light (represented by arrows) to pass through, while the opaque patterns block the light. Accordingly, portions of photo resist 46 are exposed. Photo resist 46 is then developed to form openings 50, as shown in FIG. 4. Openings 50 overlap gate silicide 30 and source/drain silicide 22. The top view shapes of openings 50 may be rectangles or circles.

Figure 5:
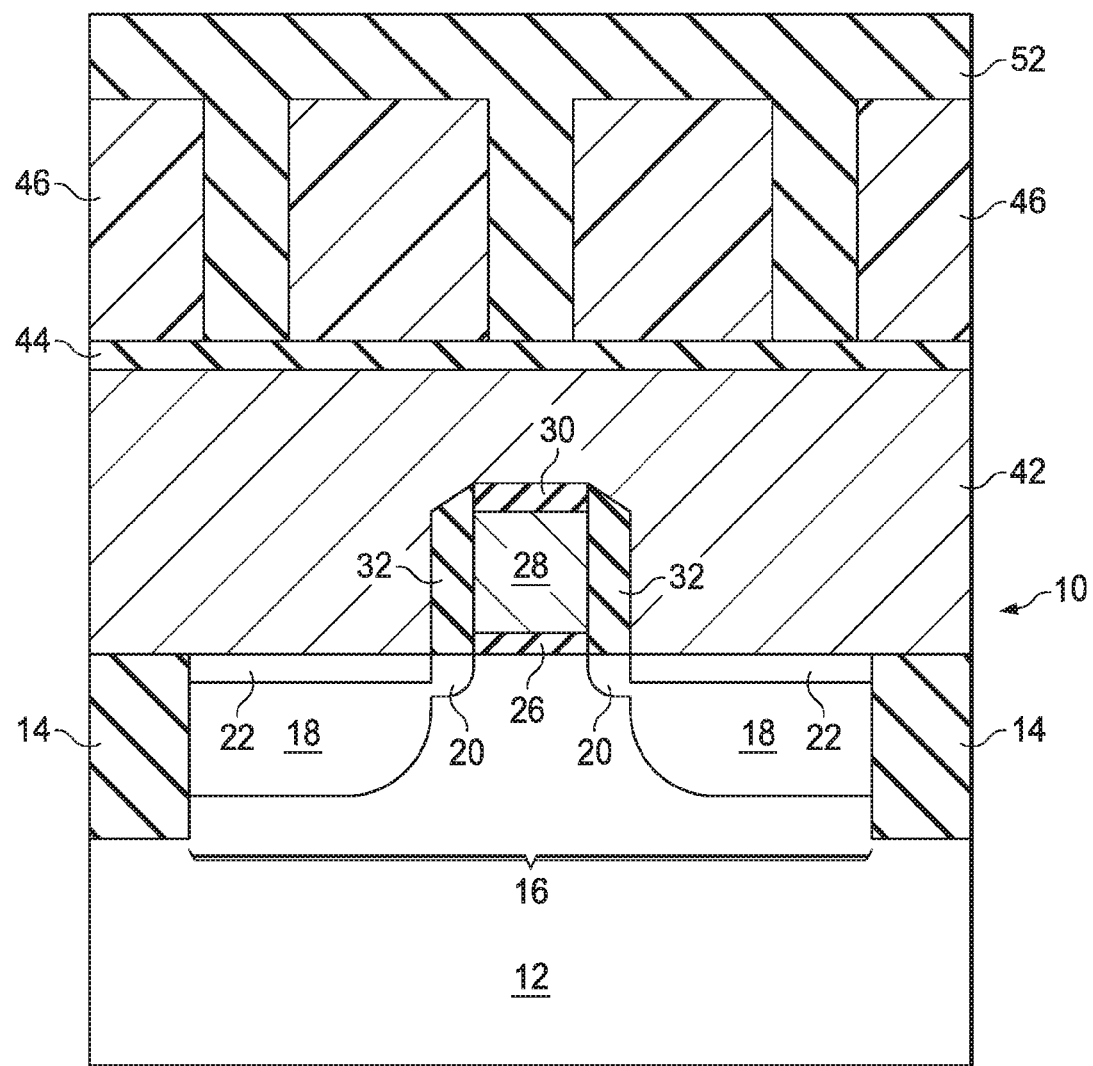

Next, as shown in FIG. 5, reverse memory layer 52 is formed. Reverse memory layer 52 is such named since the final patterns of reverse layer 52 (FIG. 6) is the reversed patterns of photo resist 46 as in FIG. 4. Reverse memory layer 52 is formed of a material that has high etching selectivity values relative to photo resist 46 and cap layer 44. In some embodiments, reverse memory layer 52 comprises an inorganic material such as silicon oxide, silicon nitride, silicon oxynitride, silicon oxycarbide, or the like. In alternative embodiments, reverse memory layer 52 is a metal-containing material comprising aluminum, manganese, cobalt, titanium, tantalum, tungsten, nickel, tin, magnesium, or alloys thereof. In yet alternative embodiments, reverse memory layer 52 comprises ceramics, which may also comprise oxygen and/or nitrogen, and a metal selected from aluminum, manganese, cobalt, titanium, tantalum, tungsten, nickel, tin, magnesium, or alloys thereof.

Since lateral dimension W1 (FIG. 4) of openings 50 is small, to prevent voids from being formed in reverse memory layer 52, a filling method that has a good gap-filling capability is used to form reverse memory layer 52. In some exemplary embodiments, Atomic Layer Deposition (ALD) is used to form reverse memory layer 52.

Figure 6:
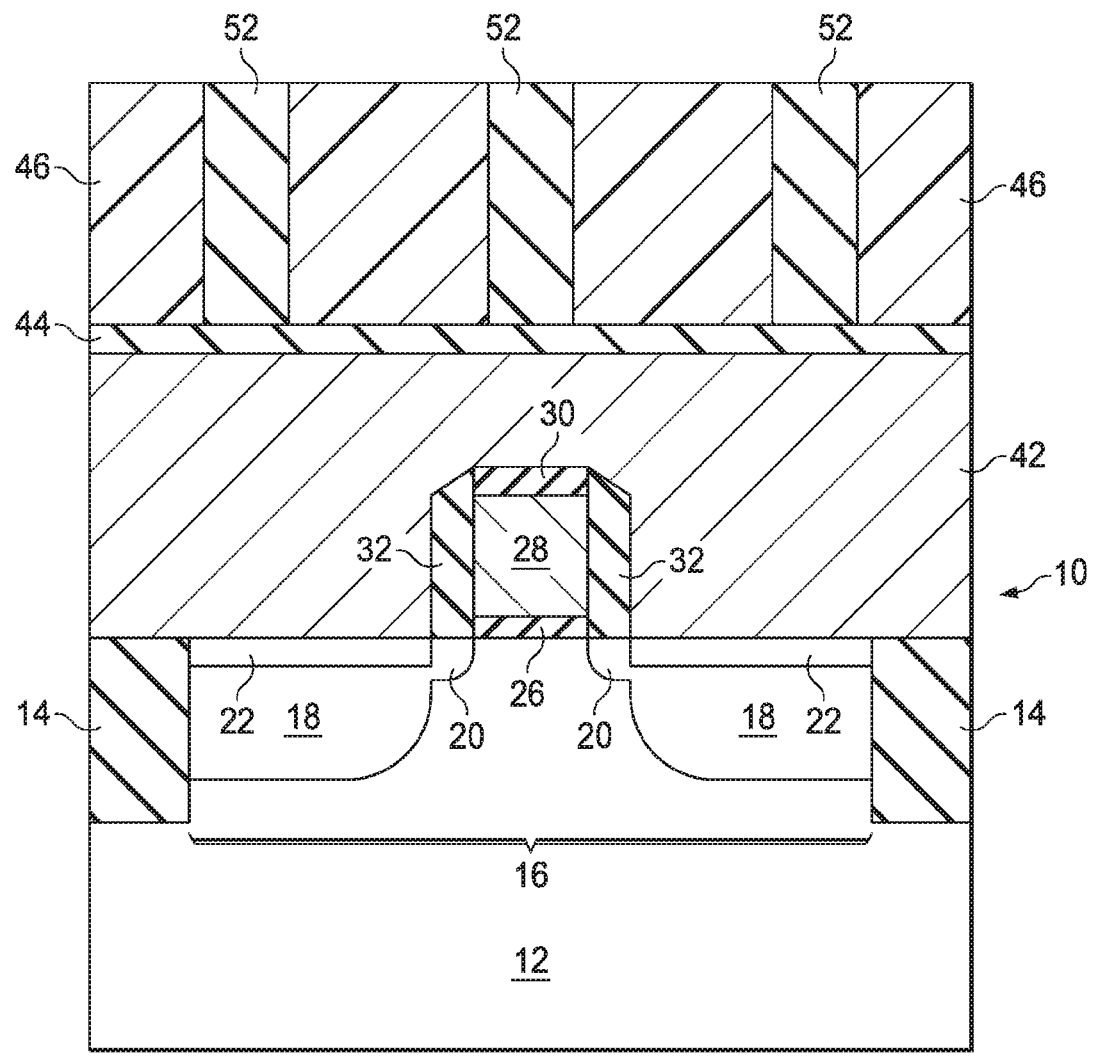

Referring to FIG. 6, reverse memory layer 52 is etched back, until the excess portions of reverse memory layer 52 over photo resist 46 are fully removed, and photo resist 46 is exposed. The etching may be performed using plasma, and the etchant gas is selected depending upon the material of reverse memory layer 52. The etching is performed using end-point detection for detecting the exposure of photo resist 46, so that the excess portions of reverse memory layer 52 are removed, while the portions of reverse memory layer 52 filled in openings 50 (FIG. 4) are not etched too much.

Figure 7:
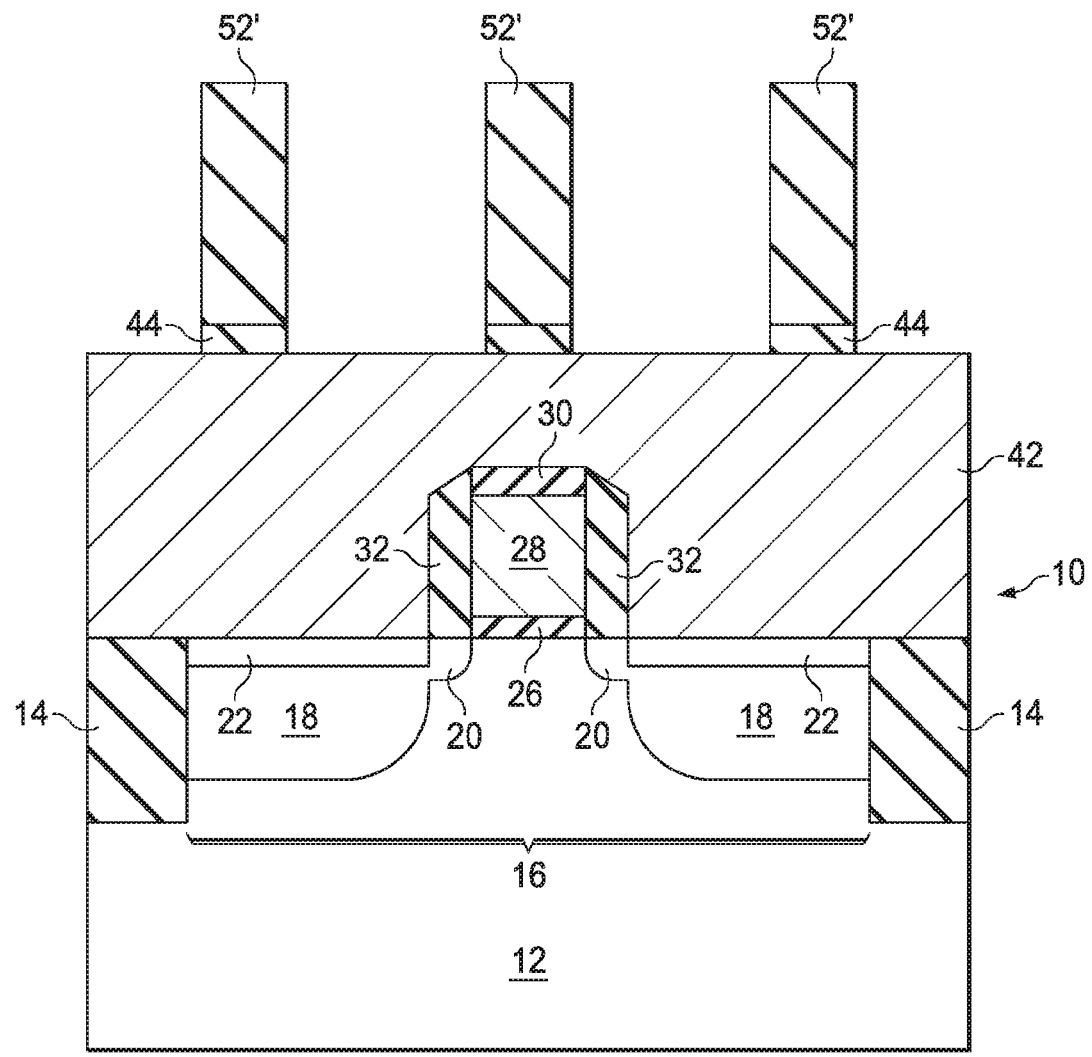

Photo resist 46 is then removed, and the resulting structure is shown in FIG. 7. Photo resist 46 may be removed using, for example, ashing. The portions of reverse memory layer 52 filled in openings 50 (FIG. 4) are left, and are referred to as reverse memory posts 52' throughout the description. Cap layer 44, which acts as an etch stop layer and a protection layer of the underlying metallic layer 42, is hence exposed. Reverse memory posts 52' may have top view shapes of circles, rectangles (such as squares), or the like.

Figure 8:
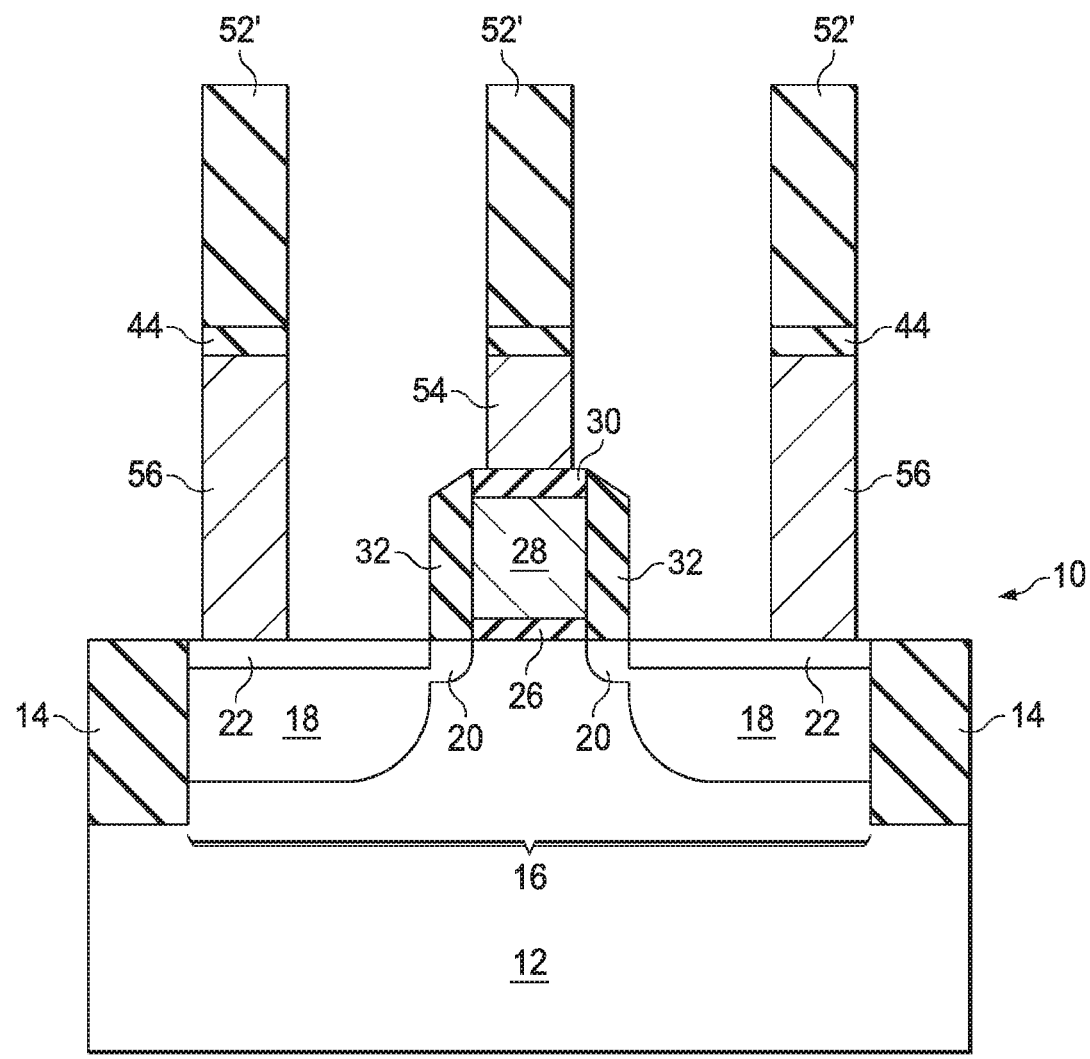
Figure 9:
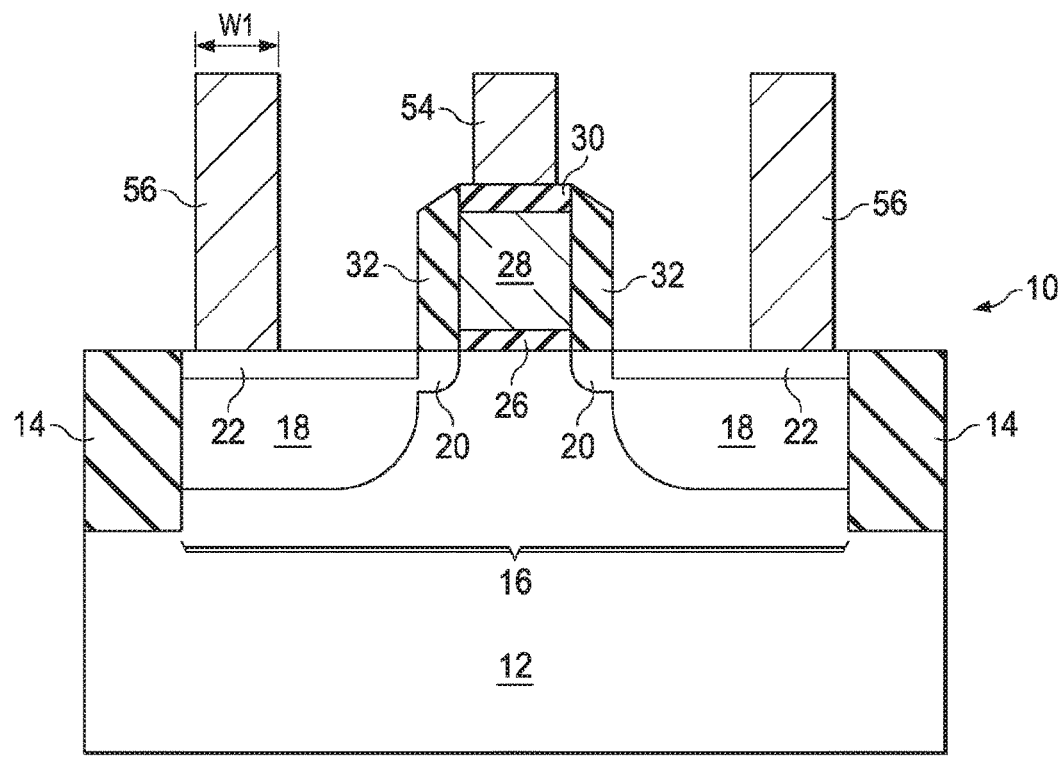

FIG. 8 illustrates the etching of cap layer 44 and metallic layer 42 (FIG. 7) using reverse memory posts 52' as an etching mask. The remaining portions of metallic layer 42 (FIG. 7) form gate contact plug 54 and source/drain contact plugs 56. Next, reverse memory posts 52' and the remaining portions of cap layer 44 are removed, and the resulting structure is shown in FIG. 9.

In the above-described embodiments, reverse memory posts 52' are formed as an etching mask to pattern metallic layer 42, rather than forming photo resist posts as an etching mask to pattern metallic layer 42. Since the lateral dimension W1 (also see the denoted lateral dimension W1 in FIG. 4) is very small, if photo resist is used to form the patterns of reverse memory posts 52', it is very difficult to prevent the tall and thin photo resist posts from collapsing. Advantageously, it is much easier to form small openings in photo resist than to form tall and thin photo resist posts, and hence reverse memory posts 52' have much better controlled dimensions than photo resist posts. In addition, reverse memory posts 52' have a greater mechanical strength than photo resist posts, and may maintain their shapes in the patterning of metallic layer 42.

Figure 10:
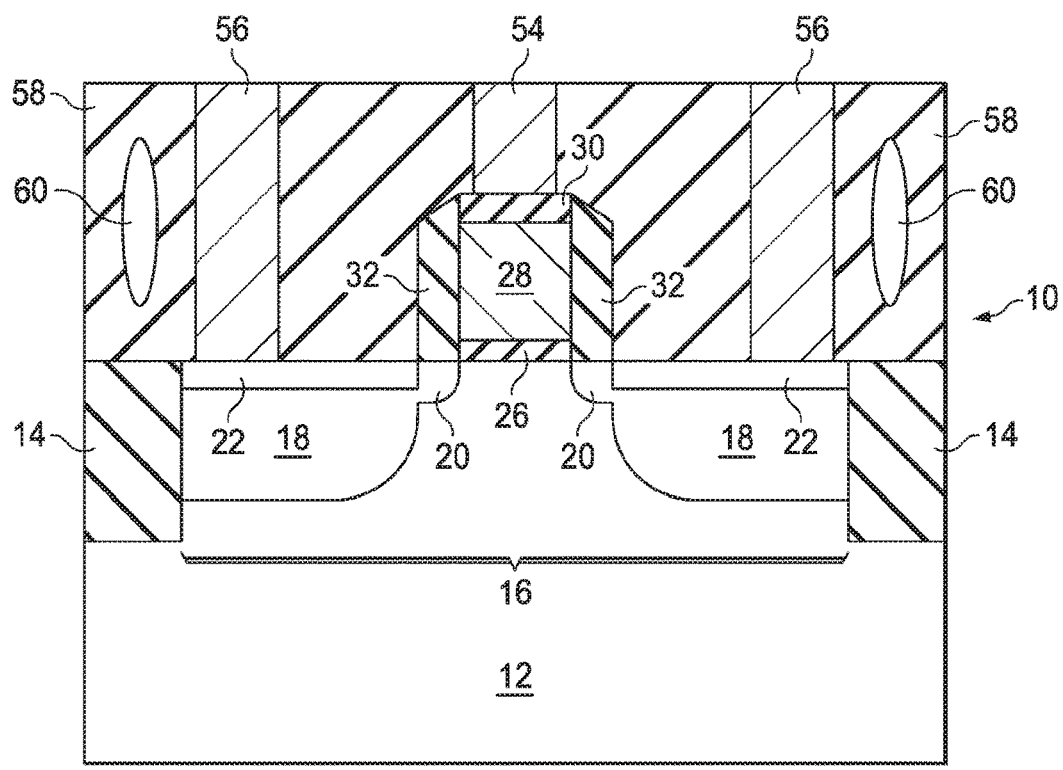

In FIG. 10, Inter-Layer Dielectric (ILD) 58 is formed to fill the space surrounding contact plugs 54 and 56. ILD 58 may have a low dielectric constant (k value) lower than 3.8, and may comprise a non-porous low-k dielectric material. In some exemplary embodiments, ILD 58 comprises silicon oxide, phosphosilicate glass (PSG), borosilicate glass (BSG), boron-doped phosphosilicate glass (BPSG), fluorine-doped silicate glass (FSG), or other inorganic dielectric materials. The ILD 58 may be homogenous, and from the top surface to the bottom surface, the entire ILD 58 is formed of the same material. ILD 58 may be formed using spin coating, a Chemical Vapor Deposition (CVD) method, or another applicable method. A CMP is performed after the filling of ILD 58, so that the top surface of ILD 58 is level with the top surfaces of contact plugs 54 and 56.

ILD 58 includes a first portion level with gate electrode 28. ILD 58 may further include a second portion overlying gate electrode 28, wherein the first portion and the second portion may be parts of the continuous ILD 58. In addition, the bottom surfaces of ILD 58 may be in contact with source/drain silicides 22 and gate silicide 30. In some embodiments, voids 60 are formed in ILD 58.

Figure 11A:
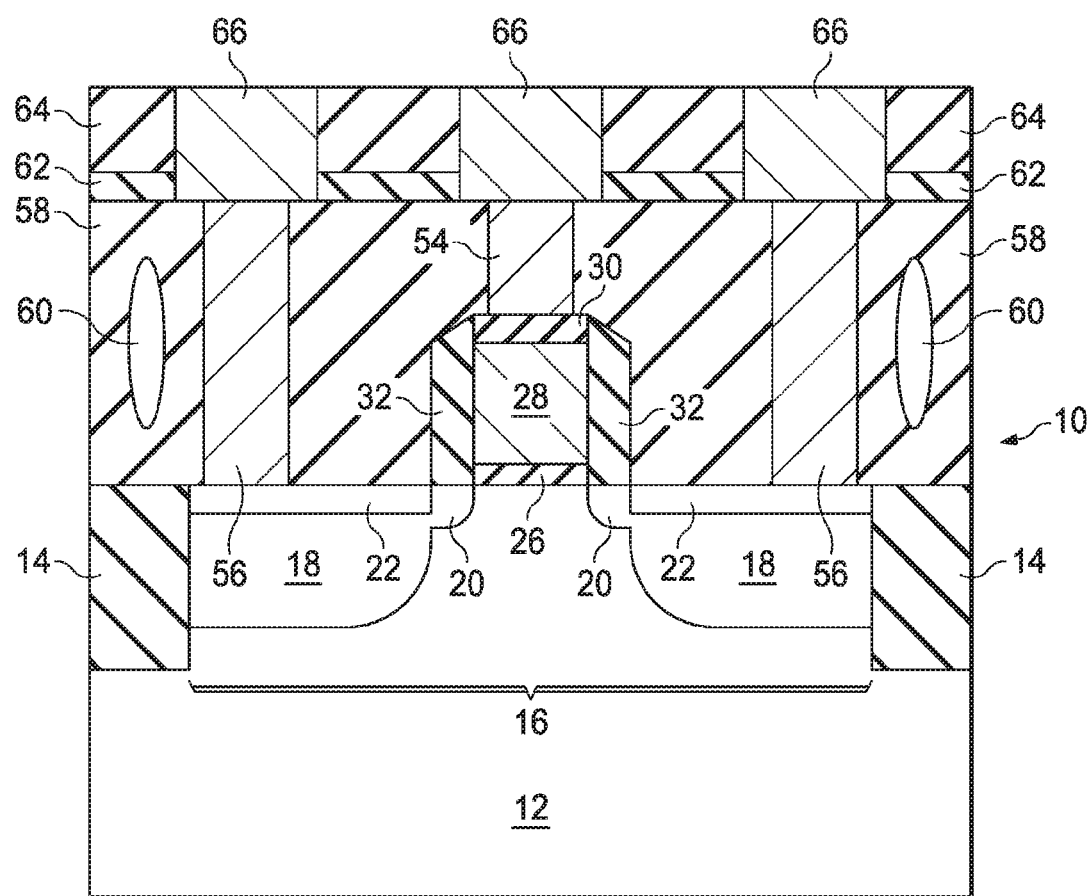
Figure 11B:
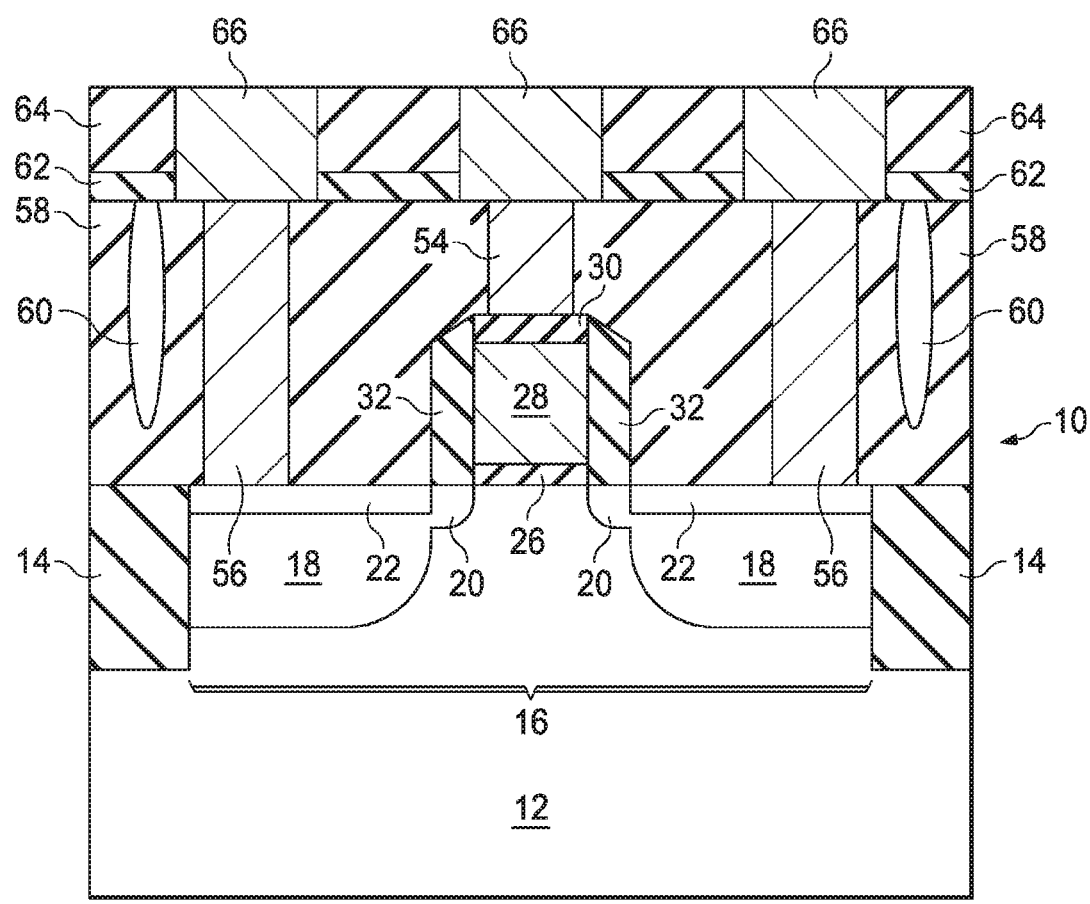

FIGS. 11A and 11B illustrate the formation of etch stop layer 62, Inter-Metal Dielectric (IMD) 64, and metal lines 66. Etch stop layer 62 may comprise silicon carbide, silicon oxycarbide, or another dielectric material. IMD 64 may comprise a low-k dielectric material, which may have a k value lower than about 3.0, lower than about 2.5, or lower. In some embodiments, metal lines 66 include copper or a copper alloy, and may further include a conductive diffusion barrier layer (such as titanium, titanium nitride, tantalum, tantalum nitride, not shown) underlying the copper or copper alloy. The formation of metal lines 66 may be performed through single damascene, for example. Metal lines 66 are electrically coupled to source/drain regions 18 and gate electrode 28 through source/drain silicides 22 and gate silicide 30, respectively.

FIG. 11A illustrates the cross-sectional view in accordance with some embodiments, wherein voids 60 are limited in ILD 58, and etch stop layer 62 is not exposed to voids 60. In these embodiments, voids 60 are fully enclosed in ILD 58. In alternative embodiments, as shown in FIG. 11B, after the CMP of ILD 58, voids 60 are exposed, and hence the bottom surface of the subsequently formed etch stop layer 62 is exposed to voids 60. In these embodiments, voids 60 are encircled by ILD 58, with the bottoms of voids 60 also being defined by ILD 58.

The embodiments of the present disclosure have some advantageous features. By forming contact plugs through the etching of a bulk metallic layer, the resulting contact plugs do not include voids therein. Accordingly, the quality and the electrical performance of the contact plugs in accordance with the embodiments of the present disclosure are not adversely affected by any void. The formation of the reverse memory layer and the using of the reverse memory layer for forming the contact plugs ensure that thin contact plugs are formed, and the problems associated with the fragile photo resist is avoided.

In accordance with some embodiments, a method includes forming a substrate layer over a device, forming reverse memory posts over the substrate layer, and etching the substrate layer using the reverse memory posts as an etching mask. Remaining portions of the substrate layer comprise a cylinder structure. The reverse memory posts are then removed.

In accordance with other embodiments, a method includes forming a metallic layer over a MOS device. The metallic layer includes a first bottom surface contacting a source/drain silicide of the MOS device, and a second bottom surface contacting a gate silicide of the MOS device. The method further includes forming a photo resist over the metallic layer, patterning the photo resist to form openings in the photo resist, and forming a reverse memory layer, with first portions of the reverse memory layer filled into the openings in the photo resist, and a second portion of the reverse memory layer overlying the photo resist. The second portion of the reverse memory layer is removed, with the first portions of the reverse memory layer remaining in the openings. The photo resist is then removed. The metallic layer is etched using the first portions of the reverse memory layer as an etching mask, wherein remaining portions of the metallic layer comprise a gate contact plug and a source/drain contact plug. The first portions of the reverse memory layer are then removed. After the etching the metallic layer, an ILD is formed to surround the gate contact plug and the source/drain contact plug.

In accordance with yet other embodiments, an integrated circuit structure includes a semiconductor substrate, and a MOS device at a surface of the semiconductor substrate. The MOS device includes a gate electrode over the semiconductor substrate, and a source/drain region on a side of the gate electrode. A gate contact plug is overlying and electrically coupled to the gate electrode. A source/drain contact plug is overlying and electrically coupled to the source/drain region. The integrated circuit structure further includes an ILD, with the gate contact plug and the source/drain contact plug disposed in the ILD. The ILD includes a void therein.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a semiconductor substrate;
    a transistor comprising:
      a gate stack;
      a gate contact plug over and electrically connected to the gate stack;
      a source/drain region on a side of the gate stack;
    an inter-layer dielectric, wherein the gate stack is in the inter-layer dielectric, and wherein the inter-layer dielectric comprises an air gap therein;
    a source/drain contact plug over and electrically coupling to the source/drain region, wherein the source/drain contact plug is in the inter-layer dielectric, wherein the source/drain contact plug is between the air gap and the gate contact plug, and wherein the air gap is spaced apart from the source/drain contact plug by a portion of the inter-layer dielectric, and wherein the source/drain contact plug is closest to the air gap than any other air gap in the inter-layer dielectric; and
    a dielectric layer over the inter-layer dielectric, wherein a bottom surface of the dielectric layer is exposed to the air gap.

2. The device of claim 1, wherein the source/drain contact plug comprises a center portion and opposing edge portions on opposing sides of the center portion, wherein the opposing edge portions are in physical contact with the inter-layer dielectric, and wherein the center portion and the opposing edge portions are formed of a same material.

3. The device of claim 1, wherein the portion of the inter-layer dielectric has a first sidewall exposed to the air gap, and a second sidewall contacting the source/drain contact plug, with the first sidewall and the second sidewall being opposing sidewalls of the portion of the inter-layer dielectric.

4. The device of claim 3 further comprising:
    a gate spacer on a sidewall of the gate stack;
    a source/drain silicide region over and contacting the source/drain region, wherein the source/drain silicide region is in physical contact with the source/drain contact plug; and
    a shallow trench isolation region extending into the semiconductor substrate, wherein the source/drain silicide region extends from the shallow trench isolation region to a sidewall of the gate spacer, and the source/drain contact plug is laterally spaced apart from both of the shallow trench isolation region and the gate spacer.

5. The device of claim 1, wherein the air gap comprises a portion lower than a top surface of the gate stack.

6. The device of claim 1, wherein the source/drain contact plug is between the air gap and the gate stack, and wherein a portion of the inter-layer dielectric is between the air gap and the gate stack.

7. The device of claim 1, wherein the source/drain contact plug comprises an aluminum-comprising material, and the aluminum-comprising material extends from a top surface to a bottom surface of the source/drain contact plug.

8. The device of claim 1, wherein the source/drain contact plug comprises a tungsten-comprising material, and the tungsten-comprising material extends from a top surface to a bottom surface of the source/drain contact plug.

9. The device of claim 1, wherein the gate stack comprises a gate silicide region, and the gate contact plug is over and contacting the gate silicide region, and wherein the gate silicide region extends laterally beyond edges of the gate contact plug.

10. The device of claim 1, wherein the bottom surface of the dielectric layer is further level with a top surface of the source/drain contact plug.

11. A device comprising:
    a gate stack;
    a gate spacer on a sidewall of the gate stack;
    a source/drain region on a side of the gate stack;
    a gate contact plug over and electrically connecting to the gate stack;
    a source/drain contact plug over and electrically connected to the source/drain region, wherein entireties of the gate contact plug and the source/drain contact plug are formed of a same material;
    an inter-layer dielectric, wherein the gate contact plug and the source/drain contact plug are embedded in the inter-layer dielectric, wherein the inter-layer dielectric comprises a void therein, and the void extends to a top surface level of the inter-layer dielectric, and wherein a portion of the inter-layer dielectric separates the void from the source/drain contact plug;
an etch stop layer over and contacting the inter-layer dielectric, wherein a bottom surface of the etch stop layer is exposed to the void;
an inter-metal dielectric over and contacting the etch stop layer; and
a conductive feature penetrating through the inter-metal dielectric and the etch stop layer to contact the source/drain contact plug, wherein the inter-layer dielectric comprises a portion between the void and the source/drain contact plug, and the portion of the inter-layer dielectric forms an interface with the etch stop layer and the conductive feature, with the interface comprising a first end contacting the gate contact plug and a second end exposed to the void.

12. The device of claim 11 further comprising:
a source/drain silicide region between the source/drain contact plug and the source/drain region, wherein both of the source/drain silicide region and the source/drain region are vertically offset from the void.

13. The device of claim 11, wherein the source/drain contact plug is between the void and the gate contact plug, with the source/drain contact plug being closest to the void and the gate contact plug than any other source/drain contact plug.

14. The device of claim 11, wherein the same material comprises a tungsten-comprising material.

15. The device of claim 14, wherein the tungsten-comprising material further comprises an additional material selected from the group consisting of aluminum, copper, titanium, tantalum, and combinations thereof.

16. A device comprising:
a semiconductor substrate;
a gate dielectric over the semiconductor substrate;
a gate electrode over the gate dielectric;
a gate silicide region over the gate electrode;
a gate spacer on sidewalls of the gate dielectric, the gate electrode, and the gate silicide region;
a gate contact plug over and contacting the gate silicide region;
an inter-layer dielectric extending from top of the gate contact plug to bottom of the gate spacer;
a void in the inter-layer dielectric, wherein the void extends to a top surface of the inter-layer dielectric; and
an etch stop layer over and contacting the inter-layer dielectric, wherein the gate contact plug comprises a top surface level with a bottom surface of the etch stop layer, and the void is spaced apart from all gate electrodes on the semiconductor substrate by the inter-layer dielectric.

17. The device of claim 16, wherein an entirety of the gate contact plug is formed of a homogenous material, and the homogenous material is in physical contact with the gate silicide region.

18. The device of claim 16 further comprising:
an inter-metal dielectric over and contacting the etch stop layer; and
a conductive feature penetrating through the inter-metal dielectric and the etch stop layer, wherein a bottom surface of the conductive feature further forms an interface with the top surface of the portion of the inter-layer dielectric, and the interface extends to the void.

19. The device of claim 16 further comprising a source/drain contact plug, wherein the source/drain contact plug is between the void and the gate contact plug, and the portion of the inter-layer dielectric is between the void and the source/drain contact plug.

20. The device of claim 19, wherein the portion of the inter-layer dielectric, comprises a first sidewall exposed to the void, and a second sidewall contacting the source/drain contact plug, with the first sidewall and the second sidewall being opposing sidewalls of the portion of the inter-layer dielectric.

* * * * *